(12) United States Patent
Kumar (10) Patent No.: US 7,391,067 B1
(45) Date of Patent: Jun. 24, 2008

(54) HYBRID MICROWAVE INTEGRATED CIRCUIT

(75) Inventor: Mahesh Kumar, Cherry Hill, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 8 days.

(21) Appl. No.: 11/339,758

(22) Filed: Jan. 25, 2006

(51) Int. Cl.
*H01L 29/80* (2006.01)
*H01L 31/112* (2006.01)

(52) U.S. Cl. .................. 257/276; 257/275; 257/277; 257/712; 257/713; 257/720

(58) Field of Classification Search .............. 257/192, 257/259, 275, 276, 277, 712, 713, 720
See application file for complete search history.

(56) References Cited

U.S. PATENT DOCUMENTS

| | | | | |
|---|---|---|---|---|
| 4,141,021 A | * | 2/1979 | Decker ................ | 257/266 |
| 4,959,705 A | * | 9/1990 | Lemnios et al. ........ | 257/532 |
| 5,496,755 A | * | 3/1996 | Bayraktaroglu ........ | 438/167 |
| 5,521,406 A | * | 5/1996 | Tserng et al. ........ | 257/276 |
| 5,614,442 A | * | 3/1997 | Tserng .............. | 438/122 |
| 6,946,717 B2 | * | 9/2005 | Hoag et al. .......... | 257/528 |
| 2004/0119140 A1 | * | 6/2004 | Nishijima ........... | 257/531 |

OTHER PUBLICATIONS

Hanson et al; Development of a GaN Transistor Process for Linear Power Applications, Nitronex Corp, Raleigh NC.
Julio Perdermo, Designing at the System Level: What Will Your Power Amplifier do in the Chip Set?, Seminar: Gaim Without Pain, Nov. 2000, Agilent Technologies.

* cited by examiner

*Primary Examiner*—Jerome Jackson
*Assistant Examiner*—Anthony Ho
(74) *Attorney, Agent, or Firm*—Duane Morris LLP (57) ABSTRACT

An integrated microwave transistor amplifier includes a AlGaN/GaN active transistor arrangement on a thinned Si 1-mil heat spreader. Elongated, plated-through vias extend from the source portions of the transistor arrangement through the spreader to a thick gold supporting layer. A matching circuit is defined on a four-mil GaAs substrate, also with a thick gold support layer. A stepped heat sink supports the matching circuit and the active transistor with surfaces coplanar. Bond wires interconnect the matching circuit with the gate or drain connections of the transistor.

18 Claims, 7 Drawing Sheets

HYBRID MICROWAVE INTEGRATED CIRCUIT

FIELD OF THE INVENTION

This invention relates to semiconductor amplifiers for radio-frequency use, and more particularly to integrated structures using GaN or AlGaN transistors for high frequency, high power applications.

BACKGROUND OF THE INVENTION

There has been a long-felt need for semiconductor amplifiers for high-power radio-frequency applications. Those skilled in the art know that "radio" frequencies as now understood extends over the entire electromagnetic spectrum, including those frequencies in the "microwave" and "millimeter-wave" regions, and up to light-wave frequencies. Many of these frequencies are very important for commercial purposes, as they include the frequencies at which radar systems, global positioning systems, satellite cellular communications and ordinary terrestrial cellphone systems operate. Development of semiconductor devices to operate with significant power in some of these radio frequencies is extremely important in improving such services.

The first semiconductor amplifiers were made from doped germanium (Ge) materials. These devices tended to be leaky, in that unwanted current flows tended to upset the desired quiescent operating point, and they had relatively low voltage standoff capability, partially as a result of the tendency to leakage. These combined to make the first semiconductor amplifiers little more than playthings, unreliable and with little power capability. It was early on recognized that silicon (Si) semiconductors were theoretically capable of much higher power and exhibited less leakage than germanium semiconductors. Many years of research and development ultimately led to the production of inexpensive Si-based transistors and amplifiers. Silicon transistor amplifiers became more and more capable as better semiconductor architectures were adopted. As an example of improvement in architecture, early transistors such as diffused transistors were three-dimensional, which tended to make heat removal difficult. A major advance was the development of planar transistors, which allowed the chip to be mounted on a heat removing substrate or sink, and reduced the thermal resistance between the active, heat-producing portion of the chip and the heat sink.

More recently, high power radio-frequency semiconductor development has included improved semiconductors, such as gallium arsenide (GaAs), gallium nitride (GaN), and silicon carbide (SiC). Gallium arsenide has been in use for many years because of its inherently greater power capability than silicon, notwithstanding heat transfer capabilities significantly worse than those of silicon. Gallium arsenide devices may be viewed as having reached a limit on their power capability, at about 2 watts per millimeter of gate periphery.

When transistors were first introduced, they were used for the most part as vacuum tubes had been. That is, they were placed in hard-wired sockets connected by wires to other components of a circuit. Eventually, the reliability of transistors became such that the perceived need for sockets was obviated, and the transistor leads were then fused or soldered directly to the circuit, often by means of solder lugs. The inherent frequency limitations of early transistors, coupled with the unwanted stray reactances of the hard-wired circuits, sharply limited the high-frequency frequency response of amplifiers made with this technology. The voltage and current limitations of the transistors also limited them to relatively low-power applications.

Eventually, it was discovered that improved transistors with sufficient high-frequency capability, together with printed-circuit-board techniques which tended to minimize stray reactances, made transistors capable of operation at frequencies approaching about one gigahertz (GHz) (1000 MHz). Unfortunately, such circuits tended to be hand-made, in that the transistors and other components were loaded by hand into printed circuit boards, and differences among the boards so produced led to significant performance differences among presumably identical units.

The introduction of microwave integrated circuits helped to solve the problem of variations among amplifiers used at frequencies above 1 GHz, and to reduce the problem of unwanted stray reactances. The microwave integrated circuit included one or more discrete transistors mounted on a substrate with separate "printed" matching circuits (matching circuits made by integrated-circuit techniques) also mounted on a substrate. Electrical connections were made between the electrodes of the transistor and the matching circuits by the use of wire bonds. Such wire bonds are exceedingly tiny, and when properly applied can provide very repeatable results.

Figure 1A:
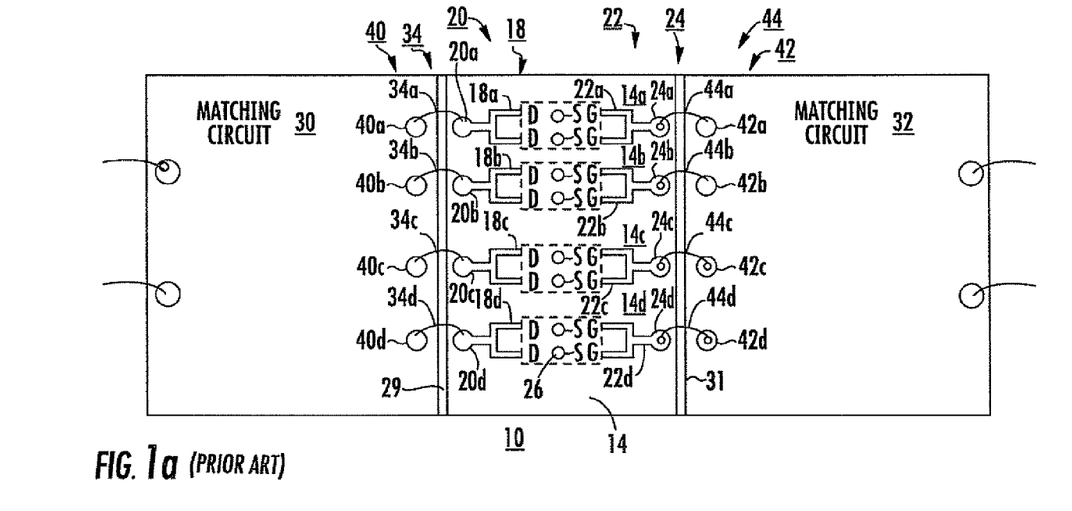
FIGS. 1a and 1b are simplified plan and cross-sectional views, respectively, of a prior-art microwave integrated circuit.
Figure 1B:
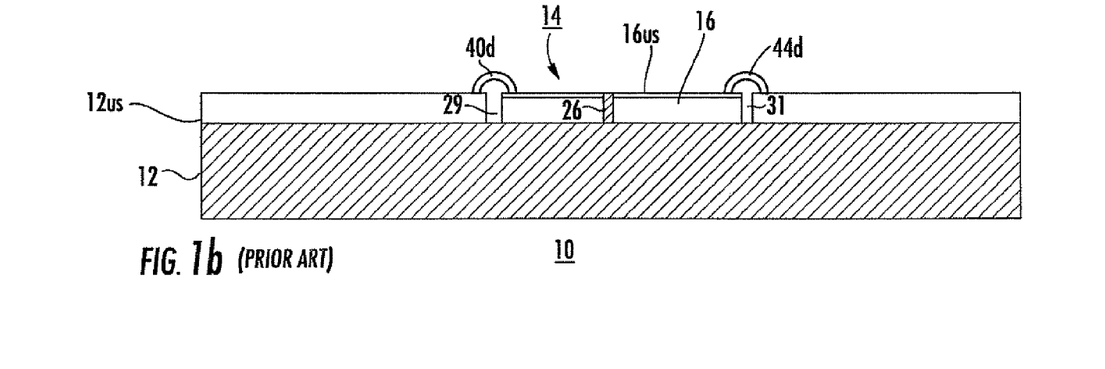

FIG. 1a is a simplified plan view of a prior-art microwave integrated circuit 10, and FIG. 1b is a cross-section thereof. In FIGS. 1a and 1b, an electrically and thermally conductive heat spreader or heat sink 12 provides a planar surface 12us on which other portions are mounted. Microwave integrated circuit 10 includes a planar discrete transistor arrangement 14 made, for example, on a GaAs substrate 16, having a thickness of about 100 micrometers (μm). The thickness of the substrate material is a compromise, in that the substrate should be as thin as possible so as to minimize the cost of GaAs material, but thick enough so that the finished chip is rugged enough to be handled. The active portion of transistor arrangement 14 is located on a thin upper or surface portion designated 16us of substrate 16, about one or two micrometers (μm) thick. This active portion is the so-called "doped" portion of the semiconductor substrate in which control of the transistor electrical conduction takes place. It happens that the control portion 16 is also the location at which unwanted heat generation is at a maximum.

The description herein includes relative placement or orientation words such as "top," "bottom," "up," "down," "lower," "upper," "horizontal," "vertical," "above," "below," as well as derivative terms such as "horizontally," "downwardly," and the like. These and other terms should be understood to refer to the orientation or position then being described or illustrated in the drawing(s), and not to the orientation or position of the actual element(s) being described or illustrated. These terms are used for convenience in description and understanding, and do not require that the apparatus be constructed or operated in the described position or orientation.

The active portion 16 of the transistor arrangement 14 of FIGS. 1a and 1b includes a plurality of individual transistor elements, each including one or more source (S), drain (D), and gate (G) electrodes. The plan view of FIG. 1a shows transistor arrangement 14 as including four separate portions 14a, 14b, 14c, and 14d. While four such portions are shown, there could be more portions or fewer such portions. Each portion 14a, 14b, 14c, and 14d includes a plurality of individual transistors, not separately shown, each of which includes at least one or more source (S), drain (D), and gate (G) electrodes. The source, drain and gate electrodes of the individual transistors must, in operation, be connected to sources and loads. The drain D and gate G electrodes are connected to by way of conductors extending laterally over (or within) the active surface of the transistor arrangement 14. More particularly, the drain D electrodes of each of the plurality of individual transistors of each portion of transistor arrangement 14 are interconnected on the transistor arrangement 14, and led to a bond or bonding pad. Thus, assuming that each transistor portion 14a, 14b, 14c, and 14d contains two individual transistors (but it may contain more or fewer), the two D electrodes of each transistor portion are interconnected by a conductor network. In FIG. 1a, the D electrodes of portion 14a of transistor arrangement 14 are connected together by an interconnecting circuit 18a of a set 18 of interconnecting circuits, the D electrodes of portion 14b of transistor arrangement 14 are connected together by an interconnecting circuit 18b, the D electrodes of portion 14c of transistor arrangement 14 are connected together by an interconnecting circuit 18c, and the D electrodes of portion 14d of transistor arrangement 14 are connected together by an interconnecting circuit 18d. The four interconnecting circuits 18a, 18b, 18c, and 18d communicate with bonding pads 20a, 20b, 20c, and 20d, respectively, of a set 20 of drain bonding pads. Similarly, the gate (G) electrodes of the transistors of the portions of transistor arrangement 14 are interconnected by conductors of a set 22 of interconnecting conductors and led to bonding pads of a set 24 of bonding pads. More particularly, the gate (G) electrodes of portion 14a of transistor arrangement 14 of FIG. 1a are connected together and to a bonding pad 24a by a conductor 22a, the G electrodes of portion 14b of transistor arrangement 14 of FIG. 1a are connected together and to a bonding pad 24b by a conductor 22b, the G electrodes of portion 14c of transistor arrangement 14 of FIG. 1a are connected together and to a bonding pad 24c by a conductor 22c, and the G electrodes of portion 14d of transistor arrangement 14 of FIG. 1a are connected together and to a bonding pad 24d by a conductor 22d.

A set of planar matching circuit arrangements 30, 32 is mounted on substrate 12 of integrated circuit 10, spaced by small gaps 29, 31 from the transistor arrangement 14. The various bonding pads of sets 20 and 24 are interconnected with corresponding bonding pads of matching circuit arrangements 30 and 32. This connection is made by bond wires which jump over the gaps 29, 31. More particularly, bonding pad 20a is connected by way of a bond wire 34a to a bonding pad 40a on matching circuit arrangement 30, bonding pad 20b is connected by way of a bond wire 34b to a bonding pad 40b on matching circuit arrangement 30, bonding pad 20c is connected by way of a bond wire 34c to a bonding pad 40c on matching circuit arrangement 30, and bonding pad 20d is connected by way of a bond wire 34d to a bonding pad 40d on matching circuit arrangement 30. The matching circuits (not illustrated) associated with matching circuit arrangement 30 make connection to bonding pads 40a, 40b, 40c, and 40d. In addition, the gate bonding pads of set 24 of bonding pads of transistor arrangement 14 are interconnected by bond wires of a set with corresponding bond pads of a set 42 of bond pads of matching circuit 32. Thus, gate bond pad 24a is connected by a bond wire 44a to a bond pad 42a, gate bond pad 24b is connected by a bond wire 44b to a bond pad 42b, gate bond pad 24c is connected by a bond wire 44c to a bond pad 42c, and gate bond pad 24d is connected by a bond wire 44d to a bond pad 42d.

Design of a transistor suitable for frequencies above about 1 GHz requires that the features such as the electrodes be tiny. This requires that the source, drain and gate electrodes, and their connections, be very close together, which in turn has an impact on the ability to route conductors over the active surface to make electrical connections. For this reason, the source (S) electrodes of the individual transistors of the transistor arrangement 14 are not taken or connected to the side, for lack of surface area in which to make the connections, so the individual transistors are operated in common-source mode by making source connections to the electrically conductive substrate 12 by way of one or more electrically conductive through vias extending vertically through the structure. The source (S) electrodes of the individual transistors of the portions of transistor arrangement 14 of FIGS. 1a and 1b are connected by way of through vias, one of which is illustrated as 26, extending through at least the semiconductor substrate 16 to make contact with the electrically conductive substrate 12. Thus, the substrate 12 becomes part of the electrical circuit.

In an effort to improve reliability of microwave integrated circuits and to avoid the need for manual assembly and manually applied bond wires, efforts were made to incorporate the transistor and the matching circuits onto the same semiconductor substrate, so as to make monolithic microwave integrated circuits (MMICs). Some of the difficulties associated with this type of structure are described in a November 2000 paper entitled *Designing at the System Level: What Will Your Power Amplifier Do in the Chip Set?*, by Julio Perdomo of Agilent Technologies. In addition to the problems there described, the type of semiconductor used for the common substrate tends to be driven by the requirements of the transistor portion. MMICs are very reliable, and are preferred to discrete circuits for military applications. However, the presence of matching circuits presents a challenge for MMICs. In particular, the matching circuits must have conductors defining, or connecting to, capacitors and inductors, and those conductors when lying above a ground plane (the conductive substrate 12) form planar transmission lines. It is desirable to have narrow conductors which, in the presence of the support substrate, provide characteristic impedance on the order of 50 ohms. Having conductor widths wider than the narrowest possible, however, tends to increase the surface area of the MMIC which is devoted to circuitry, which in turn leads to overall larger size, and to a requirement for more semiconductor material use. On the other hand, very thin conductors can be lossy and difficult to define. Factors that affect the width of a 50-ohm conductor on the surface of a matching circuit are the thickness and the dielectric constant of the semiconductor substrate material. A suitable thickness of GaAs substrate for use with matching circuits is about 100 micrometers (μm), corresponding to about 0.004 inch (4 mils).

The requirements placed on the semiconductor material and its thickness in a MMIC tend to be driven by the needs of the active transistor portion of the MMIC, which tends to relegate the requirements of the matching circuits to secondary importance. This, in turn, tends to make the design of the matching circuits difficult. The best semiconductor substrate for transistor purposes may not be the best from the point of view of the matching circuit, and yet other factors, such as cost, may be significant considerations, as described, for example, in papers entitled *Development of GaN Transistor Process for Linear Power Applications*, by A. W. Hanson et al. and *AlGaN/GaN HFETs fabricated on* 100-*mm GaN on Silicon* (111) *substrates*, by J. D. Brown et al., all of Nitronex Corporation. For example, Si has a much lower cost than GaAs, but a much lesser ultimate power capability. When cost is an overriding factor, a MMIC must be based on Si. However, the dielectric constant at high frequencies of GaAs is about 13 and its resistivity can be as high as $10^8$ ohm/cm, while those of Si are about 12 and $10^4$ ohm/cm, respectively.

The lower resistivity of the Si material translates into more lossy and generally lower impedance matching circuits than would be the case with a GaAs substrate similarly proportioned. The dielectric constant effect can be ameliorated by providing a thinner matching circuit substrate in Si than it would be in GaAs.

Semiconductor materials are known which, due to greater electron band gaps than Si or GaAs, are capable of providing greater power. GaAs is capable of providing about 2 watts per millimeter of gate periphery (2 w/mm). As an example of a material having greater band gap, silicon carbide (SiC) semiconductor materials are better thermal conductors, and have lower losses than Si devices. Silicon carbide devices appear to have an ultimate power capability of about 4 watts per millimeter of gate periphery. Gallium nitride (GaN) has the capability to provide between 5 and 10 w/mm of gate periphery. GaN has a dielectric constant of about 12.5 and resistivity of about $10^8$ ohm-cm. There is substantial interest in development of GaN for monolithic microwave integrated circuits (MMICs) because of its high power capability for the active or transistor portion, and its low loss and modest dielectric constant make it especially suitable for matching circuits. Silicon carbide and gallium nitride devices are only in a developmental state. Among the problems associated with these materials is reliability, which may be as low as 1000 hours mean time before failure (MTBF). These problems may be related to lattice match dislocations between the semiconductor chips and the substrates on which they are mounted. It has been shown that GaN-on-Si can provide good reliability, as described in the abovementioned paper by A. W. Hanson et al., of Nitronex Corporation. The development of monolithic microwave integrated circuits using SIC or GaN materials is proceeding, but it may be many years before reliable, high power MMICs are available using these technologies. In particular, Defense Advanced Research Projects Agency (DARPA) has embarked on a project to develop and improve the MTBF of GaN-on-SiC monolithic microwave integrated circuits to the range of 1E6 hours (one million hours MTBF). It is anticipated that this project may take several years to reach fruition, and it is conceivable that the desired result may never be achieved.

Improved radio-frequency MMICs are desired.

SUMMARY OF THE INVENTION

An amplifier according to an aspect of the invention comprises a Si heat spreader substrate having a thickness of about one mil (25 micrometers (μm)), and defining first and second surfaces, where the first surface supports a layer of one of AlGaN and GaN semiconductor materials. The layer of semiconductor material defines a planar active transistor arrangement including drain, gate, and source portions, and also defines conductors for interconnecting the drain and gate portions, and through vias extending from the second surface of the heat spreader to the source portions. A layer of gold extends over the second surface of the heat spreader and into the through vias to make thermal and electrical contact with the source portions. The layer of gold has a thickness of about 10 to 20 micrometers (μm). A planar matching circuit includes circuit nodes, some of which require ground connections. The planar matching circuit also includes at least connecting pads which, when the matching circuit is juxtaposed with the active transistor arrangement, are registered with one of (a) the drain conductors and (b) the gate conductors of the active transistor arrangement. The planar matching circuit is defined on a first surface of a GaAs substrate having a thickness of about 4 mils (100 micrometers (μm)). The GaAs substrate defines through vias extending from a second surface to those of the circuit nodes requiring ground connection. The GaAs substrate further includes a layer of gold with a thickness of about 1 mil extending over the second surface and into the through vias to make contact with the circuit nodes. A stepped heat sink defines first and second mutually parallel planar surfaces, the layer of gold of the heat spreader is affixed to the first planar surface of the stepped heat sink, and the layer of gold of the GaAs substrate is affixed to the second planar surface of the stepped heat sink. The distance between the planes of the first and second planar surfaces of the heat sink equal the difference between the thickness of the GaAs substrate (with its gold layer) and the sum of the thicknesses of the heat spreader and its layer of gold. Bond wire electrical interconnections extend between the connecting pads of the matching circuit and the conductors of the active transistor arrangement. In one embodiment, the transistor arrangement includes a plurality of active transistors. The transistor arrangement may further include buffer layers lying between the first surface of the Si heat spreader and the layer of one of AlGaN/GaN semiconductor materials. In a preferred embodiment, the source portions of the active transistor arrangement are elongated, and the through vias are elongated in the same direction as the elongation of the source portions.

According to another aspect of the invention, an integrated-circuit amplifier for radio frequencies comprises a transistor sheet of a first semiconductor material, such as AlGaN/GaN, which has a first power capability. The sheet defines upper and lower sides, with the upper side being associated with at least one gate, drain and source portion. The sheet also defines a thickness between the upper and lower sides, which thickness is in the range of about 2 or 3 micrometers (μm), and also defines gate and drain ports associated with the upper side of the sheet. At least one of a gate matching circuit and a drain matching circuit are defined on a matching circuit substrate, which matching circuit substrate comprises a semiconductor material, such as GaAs, having lesser power capability, when used for a transistor, than the first semiconductor material. The matching circuit substrate defines upper and lower surfaces, and a thickness between the upper and lower surfaces, such as about 4 mils, which is substantially greater than that of the sheet. The matching circuit defines ports which are registered with the pattern of one of the gate and drain ports of the sheet when the one of the gate and drain ports of the sheet are juxtaposed with the ports of the matching circuit. A planar heat spreader substrate is made from one of an insulating and semi-insulating material, such as sapphire and Si, respectively, having thermal conductivity substantially less than that of the first semiconductor material. The heat spreader substrate defines first and second mutually parallel surfaces. The first of the mutually parallel surfaces of the heat spreader substrate is affixed to the lower side of the sheet for thermal communication therewith, which may be a monolithic affixation. A heat sink defines at least first and second planar surfaces, with the first planar surface extending above the second planar surface by a distance equal to the difference between the thickness of the matching circuit substrate and the sum of the thicknesses of the sheet and the heat spreader. The second side of the heat spreader is mounted on the first planar surface of the heat sink, and the lower surface of the matching circuit is mounted on the second planar surface of the heat sink, whereby the active side of the sheet lies in substantially the same plane as the upper side of the matching circuit. An electrically and thermally conductive through via extends from at least one source on the active side of the sheet, through the sheet and the heat spreader, to make contact with the first surface of the heat sink. The electrical and thermal conductivity may be provided by a layer of gold extending into the through via and over the second surface of the heat spreader. In one embodiment of this aspect, one or more of the source portions is elongated in a direction parallel with the active surface, and the through via is elongated in the same direction as the source electrode. This aspect of the invention may include a second matching circuit, which is the other one of the gate matching circuit and drain matching circuit, and the heat sink further comprises a third planar surface coplanar with the second planar surface, on which the second matching circuit is mounted. The matching circuit is electrically connected to conductors of the transistor arrangement, as by bond wires.

A method according to an aspect of the invention is for fabricating a power microwave integrated circuit. The method comprises the steps of defining a plurality of planar active transistor arrangements on a AlGaN or GaN surface layer of a Si wafer, where the Si wafer also defines a second surface. Each of the active transistor arrangements defines source, drain, and gate electrodes. A temporary support substrate is removably affixed, as for example by adhesive, to that side of the Si wafer bearing the surface layer. The second surface of the Si wafer is thinned, as by grinding or polishing, to a wafer thickness such that, in the absence of the temporary support substrate, the wafer could not be handled without breakage. In one mode of the method, this wafer thickness is about one mil. Through vias are defined, as by laser drilling, with the through vias extending from the thinned second surface, and through the Si wafer to at least some of the source electrodes of the active transistor arrangements. A layer of gold is applied to the thinned second surface of the Si substrate, and into the through vias, to a thickness sufficient to allow individual dies separated from the wafer to be handled, which in one mode is 10 to 20 micrometers (µm) thickness. The transistor arrangements are separated into individual dies, as by scoring and breaking, or by sawing, with the result that each individual die includes a portion of the temporary support substrate. That portion of the temporary support substrate associated with the individual die is removed from each of the individual dies, to form a plurality of completed transistor arrangement dies, each with a gold mounting surface and an active surface. The removal may be effected, when adhesive is used, by dissolving or corroding the adhesive. A planar matching circuit is obtained. The matching circuit is defined on a first surface of a substrate. The substrate also has a second surface, and a selected thickness between the first and second surfaces, which selected thickness is different from the thickness of a completed transistor arrangement die. In one mode, the thickness of the matching circuit substrate is about 4 mils. A heat sink is obtained. The heat sink defines first and second mutually parallel planar areas, where the planes of the first and second mutually parallel planar areas are separated by a distance substantially equal to the difference between the thickness of a completed transistor arrangement die and the selected thickness of the planar matching circuit. The gold mounting surface of one of the completed transistor arrangement dies is mounted on the first planar area and a second surface of the planar matching circuit on the second planar area, with the active surface of the completed transistor arrangement die substantially coplanar with the first surface of the planar matching circuit. A circuit on the first surface of the planar matching circuit is interconnected with one of a gate and drain portion of the completed transistor arrangement die, as by the use of wire bonds. The step of affixing a temporary support substrate to that side of the Si wafer bearing the surface layer may include the steps of applying a layer of removable adhesive material to that side of the Si wafer bearing the surface layer, and applying the temporary support substrate to the adhesive material. The step of thinning the second surface may comprise the further step of grinding andor polishing the second surface.

In a particularly advantageous mode of the method, the step of defining a plurality of planar active transistor arrangements on a AlGaN or GaN surface layer of a Si wafer includes the steps of applying an epitaxial AlGaN or GaN layer to a first surface of the Si wafer, and defining a plurality of the active transistor arrangements in and on the AlGaN/GaN layer using photolithography and doping.

BRIEF DESCRIPTION OF THE DRAWING

FIG. 2b is a simplified cross-section of the wafer of FIG. 2a, FIG. 2c is a plan view of one of a plurality of transistor arrangements which may be defined on the surface of the wafer of FIG. 2a, FIG. 2d is a cross-section of one of the transistor arrangements of FIG. 2c with a layer of photoresist applied to the upper surface of the wafer of FIG. 2a, FIG. 2e illustrates the result of turning over the arrangement of FIG. 2d, and applying a temporary support substrate to the photoresist.

DESCRIPTION OF THE INVENTION

The invention is based in part upon the understanding that a radio-frequency semiconductor amplifier has high capacitive impedance at its common-source input and output ports, and that the amount of power which can be produced into a nominal 50-ohm or 75-ohm load can be optimized over a given bandwidth by the use of input andor output matching filters or matching circuits. These filters are necessary for optimum performance, but need not be placed on the same semiconductor material as the transistor. The invention is also based in part upon an understanding that ideal microwave integrated circuit amplifier structures may not be achievable, or immediately achievable, and that compromises may be required to achieve the goal of high reliability, high power microwave integrated circuits.

GaN on Si substrates have demonstrated the potential to achieve power densities of 5 to 10 w/mm and higher with a MTBF of 1E6 hours. Silicon substrates are relatively desirable from a cost viewpoint. However, Si substrates are relatively poor thermal conductors, and have an order of magnitude (ten times) higher transmission loss than GaAs or SiC substrates. Due to the higher losses of the Si substrates and the relatively poor thermal conductivity of the Si in the conventional GaN-on-Si monolithic microwave integrated circuit structure, the overall power capability is reduced to a maximum of about 3 w/mm. Thus, conventional GaN-on-Si monolithic microwave integrated circuits do not exhibit any advantage over other established technologies, such as high voltage (HV) GaAs MESFET and pHEMT, or SiC MESFET.

According to an aspect of the invention, a thin semiconductor chip of GaN or AlGaN bears a high electron mobility transistor (HEMT) device. This chip has a thickness, in one embodiment, of 0.001 inch (about 25 micrometers). The chip may include a plurality of source, drain and gate electrodes, with some interconnections among the drain electrodes and the gate electrodes, and bonding pads for the drain and gate connections. This thin semiconductor chip is supported by, or grown on, a thin Si substrate acting as a heat spreader, and in one embodiment the HEMT device is defined in an epitaxial layer supported by the Si heat spreader. In this embodiment, the Si layer is about 1 mil thick. Through vias extend through the Si substrate to make contact with the source electrodes and a conductive layer overlying that side of the thin Si substrate remote from the HEMT device. In one embodiment, the conductive layer is gold having a thickness in the range of 10 to 20 micrometers (μm), and the total thickness of the chip is about 40 to 50 micrometers (μm). In this embodiment, the gold layer provides the principal support during handling for the separated die including the Si heat spreader and the epitaxial HEMT device. The through vias, according to an aspect of the invention, are elongated in a direction transverse to the direction of electric current flow, and provide significant high-thermal-conduction paths extending parallel with the thermal conduction provided through the Si substrate. According to another aspect of the invention, drain and gate matching circuits are made on GaAs substrates having a thickness, after thinning, of about 4 mils or 100 micrometers (μm). The Si heat spreader with its HEMT transistor is mounted on a raised portion of a stepped heat sink. The raised portion of the stepped heat sink extends above adjacent portions of the heat sink by the difference between the thicknesses of (a) the Si heat spreader (and its active transistor) and (b) the substrate of the matching circuits. In one embodiment, the raised portion extends about 50 micrometers (μm) above the adjacent portions, which is the difference between the 100 micrometers (μm) thickness of the matching circuit substrate(s) and the 50 micrometer (about 2 mils) thickness of the heat-spreader-plus-HEMT. The thin heat spreader allows the through vias to provide ground connections for the source electrodes notwithstanding the spreading of the via hole with increasing depth from the entry point, without having the through vias overlapping onto the adjacent gate or drain electrodes. Thus, the very thin heat spreader allows the source, gate and drain electrodes to be more closely spaced than might otherwise be possible.

Figure 2A:
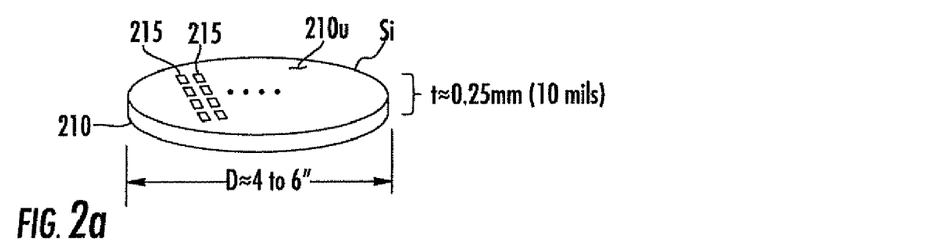
FIG. 2a is a simplified illustration of a semiconductor wafer which is to be used to fabricate transistors according to an aspect of the invention.
Figure 2B:
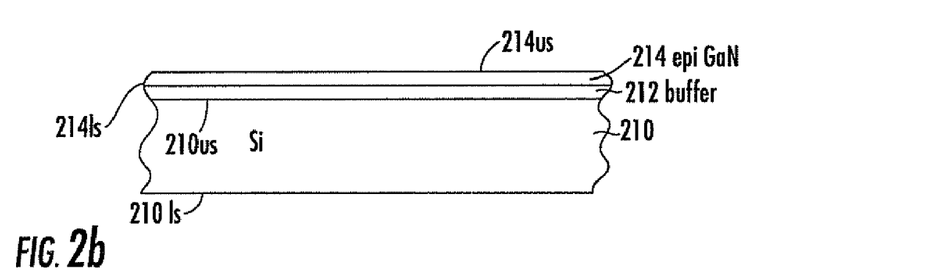

A fabrication process for the GaN-on-Si hybrid MMIC high power amplifier is described in conjunction with FIGS. 2a, 2b, 2c, 2d, 2e, 2f, 2g, 2h, 2i, 2j, 2k, 3a, 3b, 3c, 3d, 3e, 3f, 3g, 3h, 3i, 4a, 4b, and 4c. The fabrication of the GaN-on-Si transistor is described in conjunction with FIGS. 2a, 2b, 2c, 2d, 2e, 2f, 2g, 2h, 2i, 2j, and 2k. The starting point is a large, thick substrate or wafer 210 of semi-insulating silicon (Si), as illustrated in FIG. 2a. A substrate 210 thickness of about 10 mils (0.25 mm) and a diameter of 4 to 6 inches may be suitable from a cost point of view, but other thicknesses and diameters may be used. A multilayer GaN epitaxial material 214 is deposited on a surface of the substrate, with suitable buffer or transition layers 212 to accommodate crystal lattice mismatch, as known in the art, and as illustrated in FIG. 2b. The GaN layers 214 are variously doped to produce the active transistor layer. This active transistor layer has a thickness of about 2 or 3 micrometers (μm) (about 0.01 mil). Standard photolithography, application of resist materials, etching, and doping, or equivalent steps, are taken to produce the active transistors 215. Such steps are described, for example, in the abovementioned J. D. Brown and A. W. Hanson articles. The photolithograpy, etching and doping technique results in an array of transistor arrangements being defined on the surface of wafer 210, as suggested in FIG. 2a. One of the active transistors 215 defined on the wafer is illustrated in plan view in FIG. 2c, and defines elongated source (S), gate (G) and drain (D) electrodes, and interconnecting conductors 211g and 211d interconnecting at least some of the gate (G) electrodes and some of the drain (D) electrodes, and also providing bonding pads 211gp and 211gd for the gate G and drain D conductors, respectively.

Figure 2C:
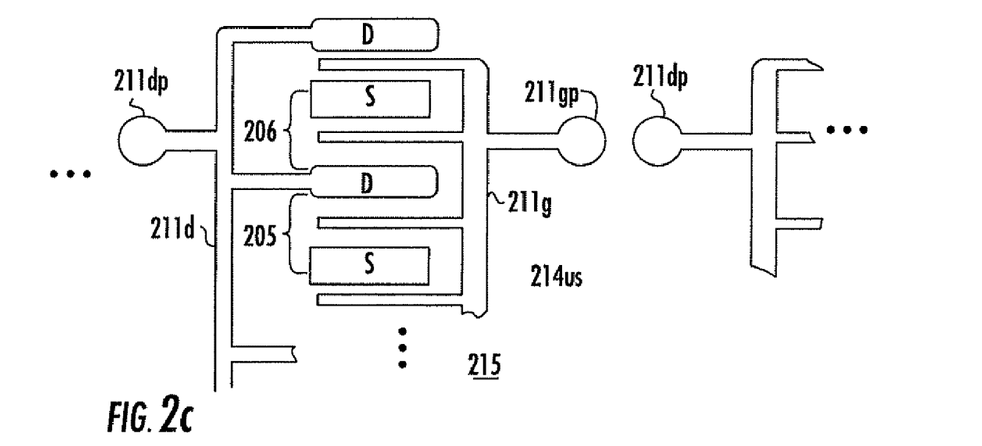
Figure 2D:
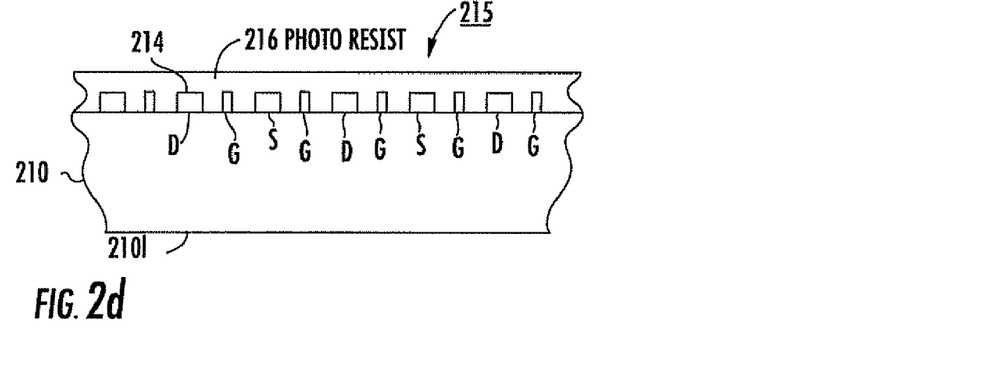
Figure 2E:
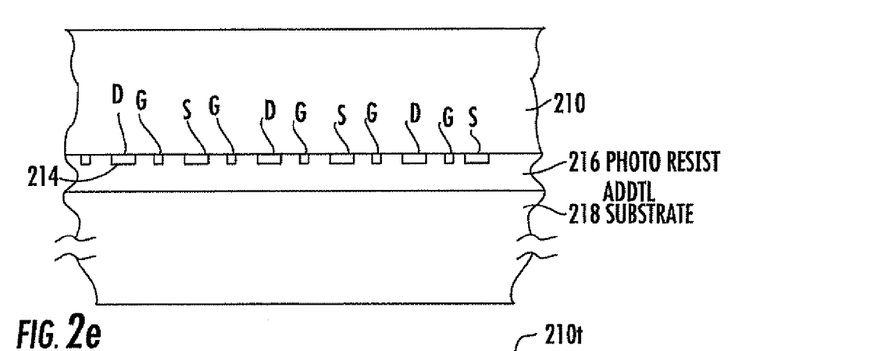
Figure 2F:
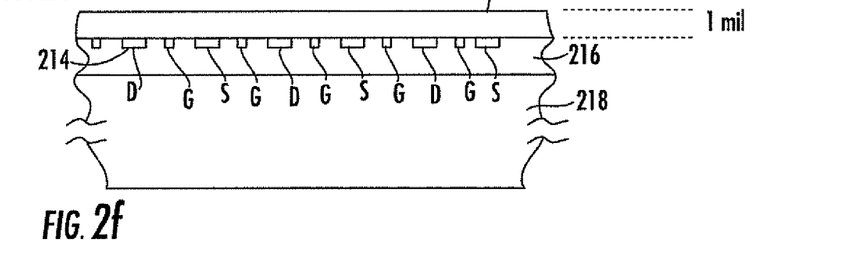
FIG. 2f represents the result of thinning the wafer or substrate.
Figure 2G:
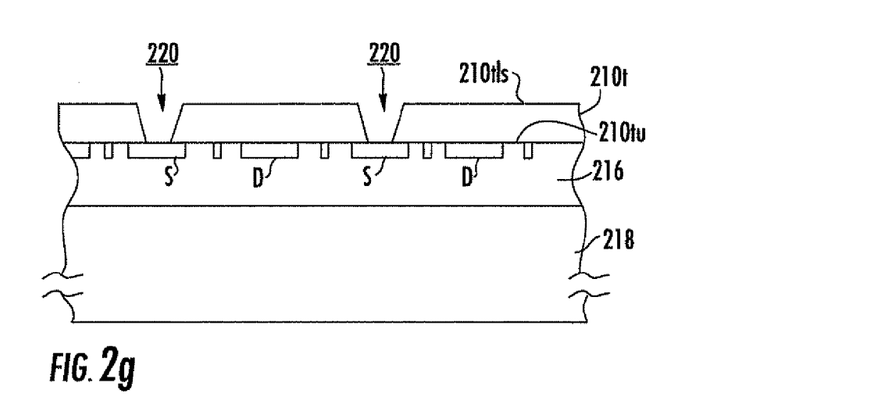
FIG. 2g represents the result of defining vias through the thinned wafer to the source electrodes.

Following the definition of the active GaN or AlGaN active transistors 215 on the wafer 210, a layer 216 of photoresist is applied thereover, as illustrated in FIG. 2d. A temporary support substrate 218 is applied to the photoresist layer 216, as illustrated in FIG. 2e. This temporary support substrate 216 may be of silicon, but it does not have to be semi-insulating. The Si substrate or wafer 210 is thinned by grinding andor polishing to a thickness of about one mil (25 micrometers (μm)), as illustrated in FIG. 2f. The thinned Si substrate 10 may be viewed as being a heat spreader for the active transistor array defined on the wafer 210. The thinned Si substrate is designated 210t.

Figure 2H:
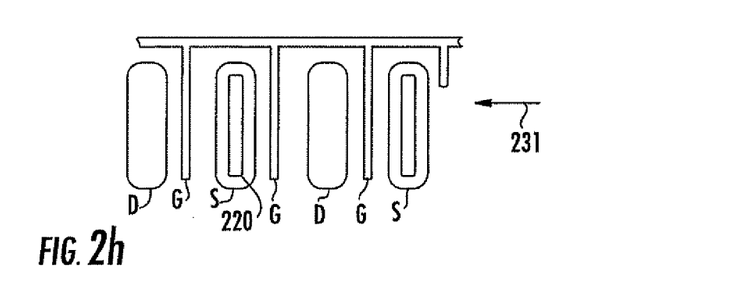
FIG. 2h is a plan view of a transistor arrangement on the surface of the wafer, showing the elongation of the source electrodes and of the through vias.
Figure 2I:
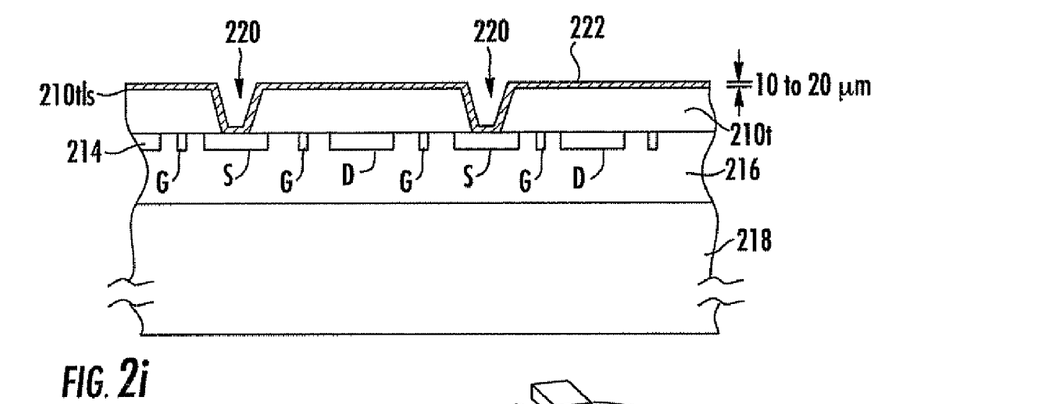
FIG. 2i is a cross-section of the transistor arrangement of FIG. 2h, with the addition of a supporting layer of gold applied over the surface of the wafer and into the through vias.

Through via holes or apertures 220 are defined through the thinned Si heat spreader 210t at the locations of the source (S) electrodes. Through vias can be formed by laser drilling or by chemical etching. It should be noted that through via apertures tend to spread or become wider at locations adjacent the front surface. If the heat spreader 10 were to be of normal thickness for a transistor, say 100 micrometers (μm) as in the prior art, the spreading of the through vias might result in overlapping of the source via connections onto adjacent gate or drain regions. As illustrated in FIG. 2h, the through vias 220 are elongated in a direction parallel to the direction of elongation of the source (S) electrodes, and transverse to the direction of electric current flow in the transistor, which direction is indicated in FIG. 2h by the arrow 231. A layer 222 of gold is applied to the exposed surface of Si heat spreader 210t and into the through vias 220 to make contact with the source (S) electrodes, as illustrated in FIG. 2i. This layer 222 of gold is selected to be of a thickness sufficient to provide support to the thinned Si heat spreader 210t and its active transistor portion 215 during handling, in the absence of temporary support substrate 218. A suitable thickness of gold may be on the order of 10 to 20 micrometers (μm).

Figure 2J:
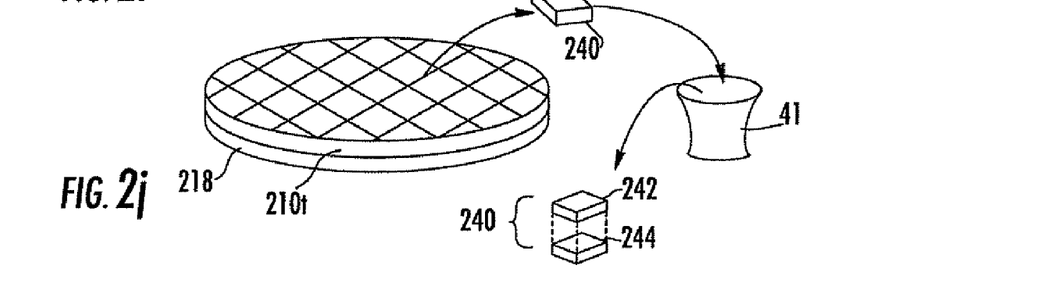
FIG. 2j is an illustration of the completed wafer with individual chips cut away from the parent wafer, and also suggesting the removal of the photoresist to thereby form a completed transistor arrangement on a thinned substrate.
Figure 2K:
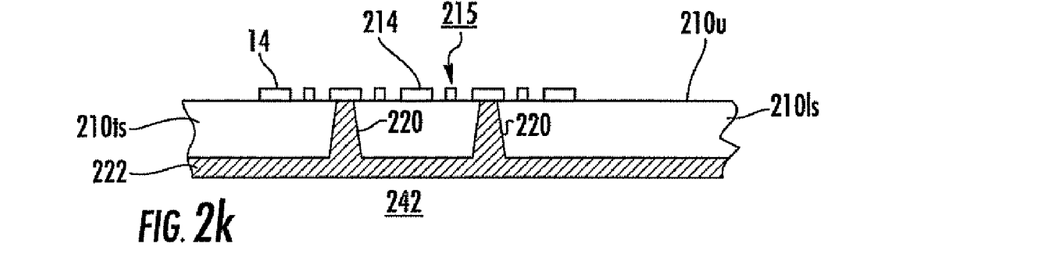
FIG. 2k is a simplified cross-sectional view of an individual chip after removal of photoresist.

FIG. 2j represents the scribing and dicing, or sawing apart of individual dies of Si heat spreader 210t with its active transistor array and its temporary support substrate, to produce individual dies 240, each of which carries one transistor arrangement 215, together with its temporary support substrate. Each transistor arrangement may include plural transistors, as illustrated in FIG. 2c. The separated dies 240, including die 240, are processed, as by immersion in a solvent, as suggested by the beaker 241, to remove the photoresist 216. With the photoresist 216 dissolved or etched away, the temporary support substrate 218 portion of the die falls away from the separated dies 240, as suggested by portion 244 of FIG. 2j. With the support substrate portion 244 of the dies removed, a plurality of self-supporting dies similar to 42 of FIG. 2k are produced. Separated die 242 of FIG. 2k has a thinned Si substrate or heat spreader portion 210t, which is designated 210ts to indicate that it is both thinned and separated or diced. Thinned, diced substrate 210ts defines or carries an active transistor portion 215 on one surface, and through vias 220 extending through the heat spreader 210ts to the source (S) electrodes of the active transistor arrangement 215. A layer 222 of gold applied to the back or underside of the heat spreader 210ts extends into the through vias 222 to make contact with the source S electrodes or portions of the active transistor arrangement 215, and is of a thickness sufficient to allow handling of the die. This thickness is selected, in one embodiment, to be about 10 to 20 micrometers. This completes the fabrication of the AlGaN- or GaN-on-Si transistor arrangement portion of the microwave integrated circuit according to an aspect of the invention.

Figures 3A, 3B:
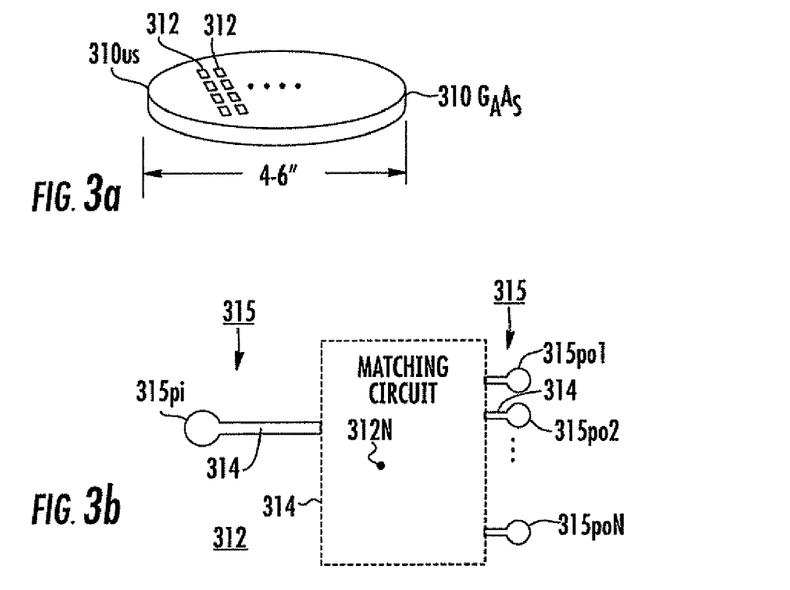
FIG. 3a is a simplified representation of a semiconductor, or possibly dielectric, wafer which is to be used to fabricate separate matching circuits according to an aspect of the invention.
FIG. 3b is a simplified plan view of one of the matching circuits which is defined on the upper surface of the wafer of FIG. 3a, FIG. 3c is a cross-section, showing electrical conductors, of a single matching circuit of FIG. 3b.
Figure 3C:
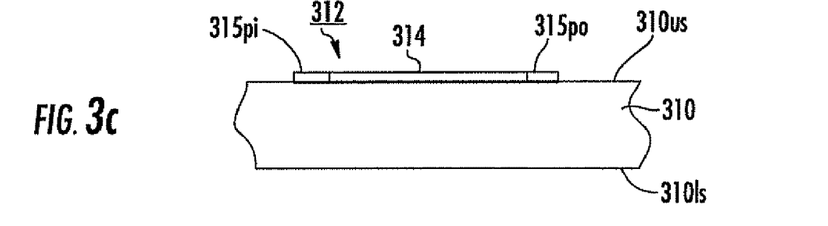

The fabrication of the matching circuits according to another aspect of the invention begins with a wafer 310 of a low-loss semiconductor or possibly dielectric material, of a size, such as four to six inches in diameter, suited to a yield providing suitable cost. This wafer may be sapphire if a dielectric or GaAs if a semiconductor. FIG. 3a illustrates a wafer 310. A plurality of matching circuits, such as 312 of FIG. 3b, are defined on the upper surface of the wafer 310 of FIG. 3a by conventional photolithograpy, deposition, etching, and the like. Each of the illustrated matching circuits, such as 312 of FIG. 3b, defines electrical conductors illustrated as a set 314, and also defines bonding pads of a set 315. An input (or output) bonding pad is illustrated as 315pi, and a plurality of "output" bonding pads for connection to the electrodes of the transistor arrangement are illustrated as 315po1, 315po2, ... 315poN. The conductors associated with the matching circuit of FIG. 3c are designated generally as 314. Matching circuits are well known in the art, and are described, for example, in U.S. Pat. No. 5,302,651 issued Apr. 13, 1993 to Yoshimasu and in US Publication 20040119140 in the name of Kind Code. Those skilled in the art recognize that the matching circuits required for the gate(s) of the transistor arrangement may be different from those required for the drain(s). The fabrication of the matching circuits is not dependent upon the particular use of the matching circuit, so the description of the fabrication is simplified to only one type 312, with the need for a second, separate fabrication being understood if the gate and drain matching circuits are unlike. In FIG. 3b, a circuit node designated 312N represents a node which requires grounding to function appropriately in the matching circuit 314.

Figure 3D:
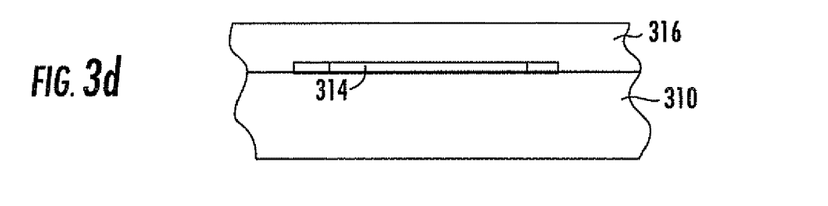
FIG. 3d illustrates the application of photoresist to the upper surface of the wafer of FIG. 3c.
Figure 3E:
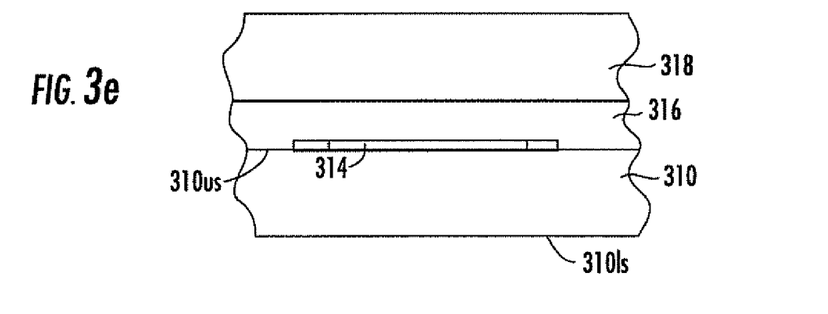
FIG. 3e illustrates the application of a temporary support substrate to the photoresist of FIG. 3d.
Figure 3F:
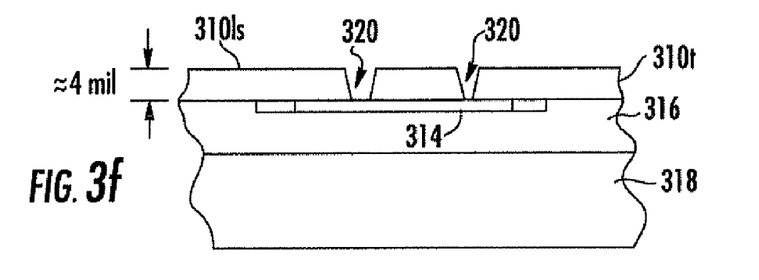
FIG. 3f is a cross-section of the arrangement of FIG. 3e with the semiconductor or dielectric substrate thinned, and with through via apertures extending therethrough so as to allow portions of the circuit to be connected to ground.
Figure 3G:
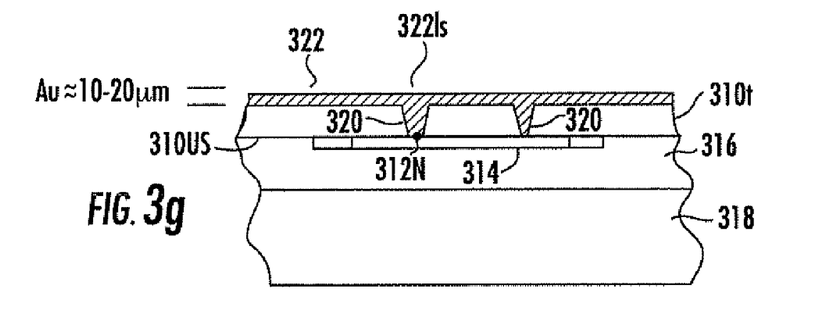
FIG. 3g is a cross-section illustrating the application of a supporting layer of gold over the surface of the semiconductor or dielectric substrate and into the through vias.
Figure 3H:
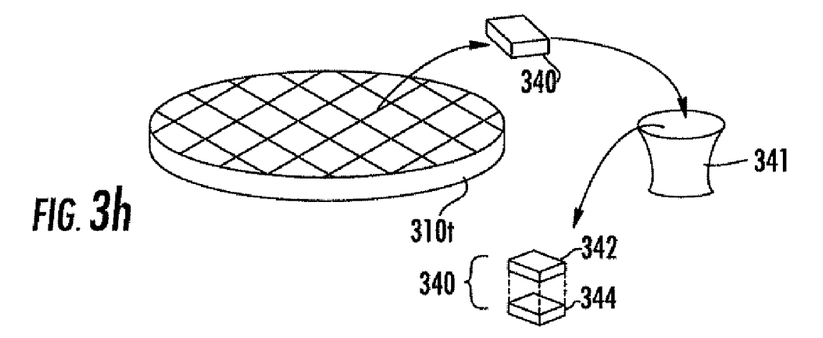
FIG. 3h represents the dicing of the completed wafer into individual dies, and also represents the removal of the photoresist.
Figure 3I:
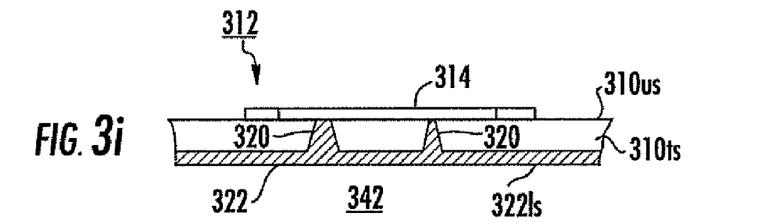
FIG. 3i is a cross-section illustrating the completed matching circuit die.

FIG. 3c is a cross-section of the single matching circuit 312 of FIG. 3b formed on upper surface 310us of wafer 310. FIG. 3d represents application of a layer 316 of photoresist onto the conductors 314 of the wafer 310, and FIG. 3d illustrates the application of a temporary support substrate 318 to the photoresist 316. In FIG. 3f, the structure has been turned over, and the wafer substrate 310 has been thinned to about 100 micrometers (about 4 mils), and as thinned is designated 310t. Also in FIG. 3f, through vias 320 have been defined through the thinned wafer substrate 310t to locations of the nodes, such as node 312N, of conductors 314 of matching circuit 312 which require ground connections. A layer 322 of gold is applied over the thinned side of the GaAs substrate 310 to a thickness, about 10 to 20 micrometers, sufficient to allow handling in the absence of the temporary support substrate 318. The processed wafer substrate 310t with its temporary support substrate 318 is then scribed and broken, or sawed, to produce a plurality of separate individual dies, one of which is illustrated as 340 in FIG. 3h. The individual dies 340 still have their temporary support substrates attached. The photoresist of the individual dies 340 is removed, as for example by etching or dissolving, represented by immersion of die 340 in a beaker 341 of solvent. With the photoresist removed, the individual dies 340 separate into a self-supporting die 342 bearing the individual matching circuit 312 and the diced temporary support substrate, illustrated as 344. FIG. 3i illustrates in simplified cross-section one of the resulting dies 342, with its GaAs thinned, separated substrate 310ts, conductors 314 of matching circuit 312 on one surface, through vias 320 extending to those nodes requiring grounding, and a layer 322 of gold overlying the surface remote from the conductors 314. The gold 322 extends into the through vias and makes contact with the appropriate nodes.

Figure 4A:
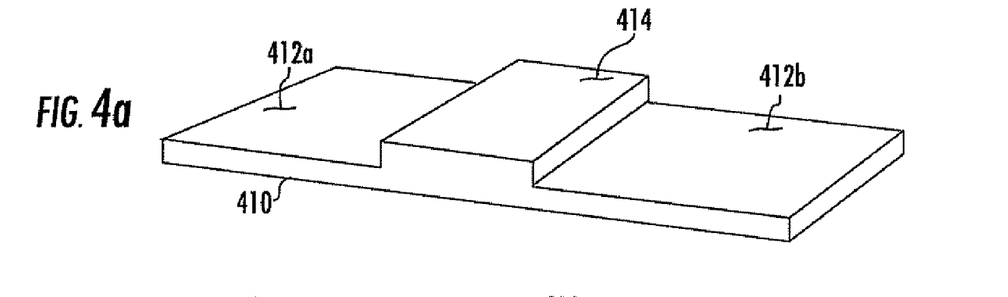
FIG. 4a is a simplified perspective or isometric view of an electrically and thermally conductive heat sink suited for mounting a transistor arrangement die and two matching circuit dies.
Figure 4B:
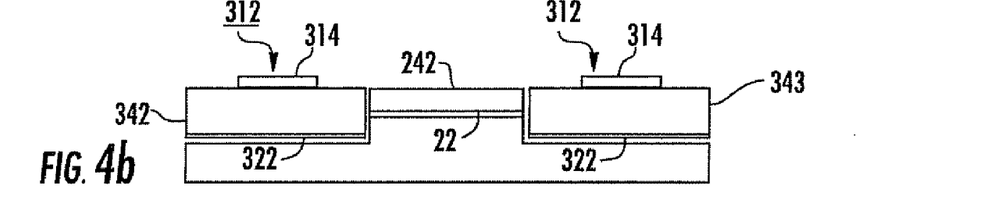
FIG. 4b is a simplified cross-sectional view of the heat sink of FIG. 4a with the addition of a transistor arrangement die and two matching circuit dies.
Figure 4C:
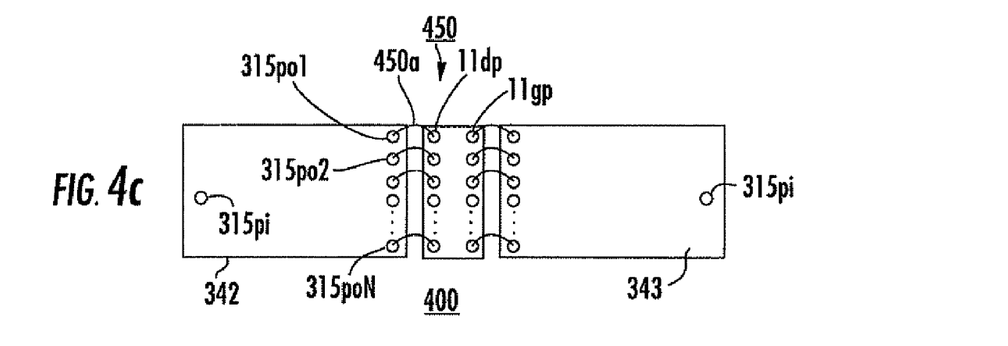
FIG. 4c is a simplified plan view of the arrangement of FIG. 4b with the addition of bond wires interconnecting the transistor arrangement with the two matching circuits.

FIG. 4a represents a stepped heat sink 410 according to an aspect of the invention. Those skilled in the art know that the term "heat sink" is a misnomer, because such structures cannot absorb heat without a temperature rise. Instead, "heat sinks" are generally simply structures for transferring heat along a desired path to other, more remote, heat sinks. Heat sinks may incorporate paths for the flow of liquid or gaseous coolants, without change in their ultimate function. The stepped heat sink 410 of FIG. 4a includes first and second generally coplanar surfaces 412a and 412b. Between surfaces 412a and 412b is a raised surface portion 414. Raised portion 414 is provided for thermal attachment to the gold side of transistor arrangement 242 of FIG. 2k, while "lower" surfaces 412a and 412b are provided for support of the gold side of drain and gate matching circuits, similar to 342 of FIG. 3i, as illustrated in cross-section in FIG. 4b. FIG. 4c is a simplified plan view of the upper surface of the structure of FIG. 4b, with the addition of bond wires of a set 450 of wire bonds interconnecting the bonding pads of the transistor arrangement with the bonding pads of the matching circuits. One of the bond wires, namely that one interconnecting matching circuit bonding pad 315po1 with transistor arrangement bonding pad 11dp, is illustrated as 450a. The structure 400 illustrated in FIG. 4c represents a complete microwave integrated circuit according to an aspect of the invention. It may be used in conjunction with other such integrated circuits in a higher-level assembly, such as a high-density interconnect (HDI) context, or it may be separately packaged, as by encapsulation, for individual use.

An amplifier (400) according to an aspect of the invention comprises a Si heat spreader substrate (210ts) having a thickness of about one mil (25 micrometers), and defining first (210u) and second (210l) surfaces, where the first surface (210u) supports a layer (214) of one of AlGaN and GaN semiconductor materials. The layer (214) of semiconductor material defines a planar active transistor arrangement (215) including drain (D), gate (G), and source (S) portions, and also defines conductors (211d, 211g) for interconnecting the drain (D) and gate (G) portions, and through vias (220) extending from the second surface (210l) of the heat spreader (210t) to the source portions. A layer (222) of gold extends over the second surface (210tl) of the heat spreader (210t) and into the through vias (220) to make thermal and electrical contact with the source (S) portions. The layer (222) of gold has a thickness of about 10 to 20 micrometers. A planar matching circuit (312) includes circuit nodes, some of which (312N) require ground connections. The planar matching circuit (312) also includes at least connecting pads (set 315p) which, when the matching circuit (312) is juxtaposed with the active transistor arrangement (215), are registered with one of (a) the drain (D) conductors (1id) and (b) the gate (G) conductors (11g) of the active transistor arrangement (215). The planar matching circuit (312) is defined on a first surface (310us) of a GaAs substrate (310) having a thickness of about 4 ails (100 micrometers). The GaAs substrate (310) defines through vias (320) extending from a second surface (3121s) to those of the circuit nodes (312N) requiring ground connection. The GaAs substrate (310) further includes a layer (322) of gold with a thickness of about 1 $E^{-3}$ inches extending over the second surface (310ls) and into the through vias (320) to make contact with the circuit nodes (312N) requiring ground connections. A stepped heat sink (410) defines first (412a) and second (414) mutually parallel planar surfaces. The layer of gold (222) of the heat spreader (210ts) is affixed to the second planar surface (414) of the stepped heat sink (410), and the layer (322) of gold of the GaAs substrate (310ts) is affixed to the first planar surface (412a) of the stepped heat sink (410). The distance or separation between the planes of the first (412a) and second (414) planar surfaces of the heat sink (410) equal the difference between the thickness of the GaAs substrate (310ts) (with its gold layer 322) and the sum of the thicknesses of the heat spreader (210ts) and its layer of gold (222). Bond wire (450) electrical interconnections extend between the connecting pads (set 315) of the matching circuit (312) and the conductors (set 211) of the active transistor arrangement (215). In one embodiment, the transistor arrangement (215) includes a plurality (205, 206) of active transistors. The transistor arrangement (215) may further include buffer layers (212) lying between the first surface (210u) of the Si heat spreader and the layer (214) of one of AlGaN/GaN semiconductor materials. In a preferred embodiment, the source (S) portions of the active transistor arrangement (215) are elongated, and the through vias (220) are elongated in the same direction as the elongation of the source portions.

According to another aspect of the invention, an integrated-circuit amplifier (400) for radio frequencies comprises a transistor sheet (214) of a first semiconductor material, such as AlGaN/GaN, which has a first power capability. The sheet (214) defines upper (214us) and lower sides, with the upper side being associated with at least one gate (G), drain (D) and source (S) portion. The sheet (214) also defines a thickness between the upper (214us) and lower (2141s) sides which is in the range of about 2 or 3 micrometers, and also defines gate (G) and drain (D) ports (211dp, 211gp) associated with the upper side (214us) of the sheet. At least one of a gate matching circuit and a drain matching circuit (312) are defined on a matching circuit substrate (310), which matching circuit substrate (310) comprises a semiconductor material, such as GaAs, having lesser power capability, when used for a transistor, than the first semiconductor material (AlGaN/GaN). The matching circuit (310) substrate defines upper (310us) and lower (3121s) surfaces, and a thickness between the upper (310us) and lower (3101s) surfaces, such as about 4 mils, which is substantially greater than that of the sheet (214). The matching circuit (310) defines ports (set 315po1, 315o2, . . . ) which are registered with the pattern of one of the gate and drain ports (set 211) of the sheet (214) when the one of the gate and drain ports of the sheet (214) are juxtaposed with the ports of the matching circuit (310). A planar heat spreader substrate (210ts) is made from one of an insulating and semi-insulating material, such as sapphire and Si, respectively, having thermal conductivity substantially less than that of the first semiconductor material. The heat spreader substrate (210ts) defines first (210us) and second (210l) mutually parallel surfaces. The first of the mutually parallel surfaces (210us) of the heat spreader substrate (210ts) is affixed to the lower side of the sheet (214) for thermal communication therewith, which affixation may be monolithic. A heat sink (410) defines at least first (414) and second (412a) planar surfaces, with the first planar (414) surface extending above the second planar surface (412a) by a distance equal to the difference between the thickness of the matching circuit substrate (310ts) and the sum of the thicknesses of the sheet (214) and the heat spreader (210ts). The second side (210ls) of the heat spreader (210ts) is mounted on the first (414) planar surface of the heat sink (410), and the lower surface of the matching circuit (342) is mounted on or supported by the second planar surface (412a) of the heat sink (410), whereby the upper or active side (214us) of the sheet (414) lies in substantially the same plane as the upper side of the matching circuit (342). An electrically and thermally conductive through via (220) extends from at least one source (S) on the active side of the sheet (214), through the sheet (214) and the heat spreader (310ts), to make contact with the first surface (414) of the heat sink (410). The electrical and thermal conductivity may be provided by a layer of gold (222) extending into the through via (220) and over the second surface (3101s) of the heat spreader (310ts). In one embodiment of this aspect, one or more of the source (S) portions is elongated in a direction parallel with the active surface, and the through via (220) is elongated in the same direction as the source portion(s). This aspect of the invention may include a second matching circuit (343), which is the other one of the gate matching circuit and drain matching circuit, and the heat sink (410) further comprises a third planar surface (412b) coplanar with the second planar surface (412a), on which the second matching circuit (343) is mounted. The second matching circuit (343) is electrically connected to conductors of the transistor arrangement, as by bond wires (450).

A method according to an aspect of the invention is for fabricating a power microwave integrated circuit. The method comprises the steps of defining a plurality of planar active transistor arrangements (215 of FIG. 2a) on a AlGaN or GaN surface layer (214) of a Si wafer (210), where the Si wafer (210) also defines a second surface (210ls). Each of the active transistor arrangements (215) defines source (S), drain (D), and gate (G) electrodes. A temporary support substrate (218) is removably affixed, as for example by adhesive (216), to that side of the Si wafer bearing the surface layer (214). The second surface (210*ls*) of the Si wafer (210) is thinned, as by grinding or polishing, to a wafer thickness such that, in the absence of the temporary support substrate, the wafer could not be handled without breakage. In one mode of the method, this wafer thickness is about one mil. Through vias (220) are defined, as by laser drilling, with the through vias extending from the thinned second surface (210*tls*), and through the Si wafer (210*t*) to at least some of the source (S) electrodes of the active transistor arrangements (215). A layer (220) of gold is applied to the thinned second surface (210*tls*) of the Si substrate (210*t*), and into the through vias (220), to a thickness sufficient to allow individual dies separated from the wafer to be handled, which in one mode is about 10 to 20 micrometers thickness. The transistor arrangements (215) are separated into individual dies (240), as by scoring and breaking, or by sawing, with the result that each individual die includes a portion (244) of the temporary support substrate (218). That portion (244) of the temporary support substrate (218) associated with the individual die (240) is removed from each of the individual dies, to form a plurality of completed transistor arrangement dies (242), each with a gold mounting surface (222) and an active surface (214). The removal may be effected, when adhesive (216) is used, by dissolving or corroding (41) the adhesive (216). A planar matching circuit (314) is obtained. The matching circuit is defined on a first surface (310*us*) of a substrate (310). The substrate (310) also has a second surface (310*ls*), and a selected thickness between the first (310*us*) and second (310*ls*) surfaces, which selected thickness is different from the thickness of a completed transistor arrangement die. In one mode, the thickness of the matching circuit substrate is about 4 mils. A heat sink (410) is obtained. The heat sink defines first (414) and second (412*a*) mutually parallel planar areas, where the planes of the first (414) and second (412*a*) mutually parallel planar areas are separated by a distance substantially equal to the difference between the thickness of a completed transistor arrangement die and the selected thickness of the planar matching circuit. The gold mounting surface (222) of one of the completed transistor arrangement dies (242) is mounted on the first planar area (414) and a second surface (322*ls*) of the planar matching circuit (342) on the second planar area, with the active surface (214) of the completed transistor arrangement die (242) substantially coplanar with the first surface (314) of the planar matching circuit (342). A circuit (342) on the first surface (314) of the planar matching circuit (342) is interconnected with one of a gate (G) and drain (D) portion of the completed transistor arrangement die (242), as by the use of wire bonds (450). The step of affixing a temporary support substrate (218) to that side of the Si wafer (210) bearing the surface layer (214) may include the steps of applying a layer of removable adhesive material (216) to that side of the Si wafer (210) bearing the surface layer (214), and applying the temporary support substrate (218) to the adhesive material (216). The step of thinning the second surface (210*ls*) may comprise the further step of grinding andor polishing the second surface.

In a particularly advantageous mode of the method, the step of defining a plurality of planar active transistor arrangements on a AlGaN or GaN surface layer (214) of a Si wafer (210) includes the steps of applying an epitaxial AlGaN or GaN layer to a first surface (210*us*) of the Si wafer (210), and defining a plurality of the active transistor arrangements in and on the AlGaN/GaN layer using a method comprising photolithography and doping.

What is claimed is:
1. An amplifier, said amplifier comprising:
   a Si heat spreader substrate having a thickness of about one mil (25 micrometers (μm)), and defining first and second surfaces, said first surface supporting a layer of one of AlGaN and GaN semiconductor materials, the layer of semiconductor material defining a planar active transistor arrangement including drain, gate, and source portions, and also defining conductors for interconnecting said drain and gate portions, and through vias extending from said second surface of said heat spreader to said source portions;
   a layer of gold extending over said second surface of said heat spreader and into said through vias to make thermal and electrical contact with said source portions, said layer of gold having a thickness of about 10 to 20 micrometers (μm);
   a planar matching circuit including circuit nodes, some of which require ground connections, and also including at least connecting pads which, when said matching circuit is juxtaposed with said active transistor arrangement, are registered with one of (a) the drain conductors and (b) the gate conductors of said active transistor arrangement, said planar matching circuit being defined on a first surface of a GaAs substrate having a thickness of about 4 mils (100 micrometers (μm)), said GaAs substrate defining through vias extending from a second surface to those of said circuit nodes requiring ground connection, said GaAs substrate further having a layer of gold extending over said second surface and into said through vias to make contact with said circuit nodes;
   a stepped heat sink defining first and second mutually parallel planar surfaces, said layer of gold of said heat spreader being affixed to said first planar surface of said stepped heat sink, and said layer of gold of said GaAs substrate being affixed to said second planar surface of said stepped heat sink, the distance between the planes of said first and second planar surfaces of said heat sink being equal to the difference between the thickness of said GaAs substrate and the sum of the thicknesses of said heat spreader and said layer of gold; and
   bond wire electrical interconnections extending between said connecting pads of said matching circuit and conductors of said active transistor arrangement.
2. An amplifier according to claim 1, wherein said transistor arrangement comprises a plurality of active transistors.
3. An amplifier according to claim 1, further comprising buffer layers lying between said first surface of said Si heat spreader and said layer of one of AlGaN and GaN semiconductor materials.
4. An amplifier according to claim 1, wherein said source portions are elongated, and said through vias are elongated in the same direction as the elongation of said source portions of said active transistor arrangement.
5. An integrated-circuit amplifier for radio frequencies, said amplifier comprising:
   a transistor sheet of a first semiconductor material having a first power capability, said sheet defining upper and lower sides, said upper side being associated with at least one gate, drain and source portion, said sheet also defining a thickness between said upper and lower sides, and also defining gate and drain ports associated with said upper side of said sheet;
   at least one of a gate matching circuit and a drain matching circuit defined on a matching circuit substrate of a semiconductor material having lesser power capability, when used for a transistor, than said first semiconductor mate- rial, said matching circuit substrate defining upper and lower surfaces, said matching circuit substrate having a thickness between said upper and lower surfaces substantially greater than that of said sheet, said matching circuit defining ports which are registered with the pattern of one of said gate and drain ports of said sheet when said one of said gate and drain ports of said sheet are juxtaposed with said ports of said matching circuit;

a planar heat spreader substrate of one of an insulating and semi-insulating material having thermal conductivity substantially less than that of said first semiconductor material, said heat spreader substrate defining first and second mutually parallel surfaces, said first of said mutually parallel surfaces being affixed to said lower side of said sheet for thermal communication therewith;

a heat sink defining at least first and second planar surfaces, said first planar surface extending above said second planar surface by a distance equal to the difference between said thickness of said matching circuit substrate and the sum of the thicknesses of said sheet and said heat spreader, said second side of said heat spreader being mounted on said first planar surface of said heat sink, and said lower surface of said matching circuit being mounted on said second planar surface of said heat sink, whereby said active side of said sheet lies in substantially the same plane as said upper side of said matching circuit; and an electrically and thermally conductive through via extending from at least one source on said active side of said sheet, through said sheet and said heat spreader to said first surface of said heat sink.

6. An integrated-circuit amplifier according to claim 5, wherein:

said at least one source portion is elongated in a direction parallel with said active surface; and said through via is elongated in the same direction as said source electrode.

7. An integrated-circuit amplifier according to claim 5, further comprising the other one of said gate matching circuit and drain matching circuit; and wherein said heat sink further comprises a third planar surface coplanar with said second planar surface.

8. An amplifier according to claim 5, wherein said transistor sheet is in the form of a layer attached on said first surface of said heat spreader.

9. An amplifier according to claim 5, wherein said at least one electrically and thermally conductive through via extending from said lower side of said sheet, and through said sheet to make electrical and thermal contact with each source electrode of said sheet, is in the form of an elongated slot extending from said lower surface of said sheet through to said source portion.

10. An amplifier according to claim 9, wherein said slot has thermally and electrically conductive material affixed to its walls.

11. An amplifier according to claim 10, wherein said thermally and electrically conductive material comprises gold.

12. An amplifier according to claim 5, wherein:

said heat spreader substrate defines a generally planar lower surface generally parallel with said upper surface of at least one of said first, second, and third regions; and further comprising a heat sink at least thermally coupled to said lower surface of said heat spreader substrate.

13. An amplifier according to claim 5, wherein the semiconductor material of said heat spreader substrate comprises Si.

14. An amplifier according to claim 5, wherein said conductive means coupling said gate ports of said gate matching circuit to said gate portions of said sheet, and said conductive means coupling said drain ports of said drain matching circuit to said drain portions of said chip, comprise electrical bond wires.

15. An amplifier according to claim 5, wherein said thickness between said upper and lower sides of said transistor sheet of a first semiconductor material is in the range of about two to three micrometers (µm).

16. An amplifier according to claim 5, wherein the thickness between said first and second mutually parallel surfaces of said heat spreader is in the range of 1 mil.

17. An amplifier according to claim 5, wherein said thickness between said upper and lower surfaces of said matching circuit is about four mils.

18. An amplifier according to claim 5, wherein said first semiconductor material is one of AlGaN and GaN, said planar heat spreader substrate of one of an insulating and semi-insulating material comprises one of sapphire and silicon.

* * * * *